(12) United States Patent
Okuno (10) Patent No.: US 7,559,144 B2
(45) Date of Patent: Jul. 14, 2009

(54) METHOD FOR MAKING AN INKJET HEAD

(75) Inventor: Tetsuo Okuno, Hino (JP)

(73) Assignee: Konica Corporation, Tokyo (JP)

( * ) Notice: Subject to any disclaimer, the term of this patent is extended or adjusted under 35 U.S.C. 154(b) by 417 days.

(21) Appl. No.: 11/331,302

(22) Filed: Jan. 11, 2006

(65) Prior Publication Data
US 2006/0112554 A1    Jun. 1, 2006

Related U.S. Application Data

(62) Division of application No. 10/424,629, filed on Apr. 28, 2003, now Pat. No. 7,051,437.

(30) Foreign Application Priority Data
May 24, 2002    (JP) ............................. 2002-150101

(51) Int. Cl.
*B23P 17/00* (2006.01)
(52) U.S. Cl. .................. 29/890.1; 29/25.35; 29/890.09; 29/831; 29/832; 347/45; 219/121.73
(58) Field of Classification Search ............. 29/25.35, 29/890.1, 847, 830, 831, 832; 347/68–71; 216/27; 219/121.6, 121.61, 121.69, 121.74; 427/100
See application file for complete search history.

(56) References Cited

U.S. PATENT DOCUMENTS

| | | | | |
|---|---|---|---|---|
| 5,260,639 A | * | 11/1993 | De Young et al. | 322/2 R |
| 5,410,559 A | * | 4/1995 | Nighan et al. | 372/19 |
| 5,548,895 A | | 8/1996 | Grenci et al. | |
| 5,560,090 A | | 10/1996 | Komakine et al. | |
| 5,940,957 A | * | 8/1999 | Goto et al. | 29/611 |
| 6,070,310 A | * | 6/2000 | Ito et al. | 623/17.11 |
| 6,174,040 B1 | | 1/2001 | Hotomi | |
| 6,220,058 B1 | * | 4/2001 | Koyama et al. | 65/392 |
| 6,651,335 B2 | * | 11/2003 | Akanabe et al. | 29/890.1 |

\* cited by examiner

*Primary Examiner*—David P Bryant
*Assistant Examiner*—Tai Nguyen
(74) *Attorney, Agent, or Firm*—Frishauf, Holtz, Goodman & Chick, P.C.

(57) ABSTRACT

A laser processing method for making an inkjet head, including a step of irradiating laser light to an inkjet head material for removing a part of the inkjet head material. The laser light is emitted from a solid laser and has a wavelength of not longer than 355 nm.

16 Claims, 5 Drawing Sheets

METHOD FOR MAKING AN INKJET HEAD

This Application is a Divisional Application of application Ser. No. 10/424,629, filed Apr. 28, 2003 now U.S. Pat. No. 7,051,437, now allowed.

BACKGROUND OF THE INVENTION

The present invention relates to a laser processing method and particularly, to a laser processing method preferable for a case where a head for an inkjet printer is produced.

1. (Prior Art)

An inkjet printer by which an ink drop is jetted onto a medium and a character or image can be formed, is well known. Such an ink drop is jetted from a head at the predetermined timing by using the piezoelectric effect. Hereupon, when the image is formed by using the inkjet printer, a complex color expression or edge expression is conducted by a combination of the ink drop jetted on the medium.

2. [Problems to be Solved by the Invention]

In this connection, in order to form a high quality image, it is necessary that a jetting exit of the ink drop formed on the head is arranged at small and minute intervals. However, because, to such a small structure, wiring cables or flow path regulating plate (a plate to regulate so that the ink does not enter into an unwanted position) are attached, it is necessary that the processing of the head is carefully conducted. Herein, in the conventional art, it is conducted that, in order to flow the current for diving the head, after the conductive film (for example, metallic layer) is attached on the surface of the head, the laser light is irradiated onto the surface, and an unwanted metallic layer is removed, and the surface is formed as an electrode. When such a laser light is used, the metallic layer is removed in a narrow width, and a minute head processing can be precisely conducted.

Conventionally, for the processing of metal or ceramics, the laser light irradiated from the $CO_2$ laser as the gas laser, or the laser light of the basic wavelength (1064 nm) irradiated from the ND:YAG laser as a solid laser, is used. However, on the surface of the inkjet head which is an object to be processed, it is preferable that the surface is very smooth so that the wiring cables and parts of the flow path regulating plate can be adequately adhered so that the movement as the inkjet head is possible, and accordingly, it is necessary that, even after the processing, the smoothness is maintained. However, the processing using the laser light is naturally the thermal processing, and when the laser light is irradiated, on the surface after the processing, the soil or burr, dross are generated, and there is a problem in which the smoothness is hindered thereby. Further, there is also a probability that the de-poling (the polarity becomes a non-orientation situation)is generated in the piezoelectric material which is a material to be processed, by the heat accumulation effect when the laser light is irradiated.

In view of such a problem of the related art, the present invention is attained and an object of the present invention is to provide a laser processing method by which, while the processing surface condition of the material to be processed is maintained good, the precision processing can be conducted.

SUMMARY OF THE INVENTION

The laser processing method according to the present invention is, in the laser processing method by which the head for the inkjet printer is laser processed as a material to be processed, when the laser light from the solid laser whose wavelength is not larger than 355 nm (which is steady state transmitting condition and which does not include a drift of the wavelength) is irradiated onto the material to be processed, because a part of the irradiated material to be processed is removed, the precision processing can be conducted while the processing surface condition of the material to be processed is maintained good.

DETAILED DESCRIPTION OF THE PREFERRED EMBODIMENT

In order to suppress a soil of the surface after the laser processing, or a de-poling when a piezoelectric material is processed, the energy so much as the surface of the material to be processed is instantaneously vaporized is given, and the laser light generated so that the energy is consumed until the generated heat is transmitted to the inside, may be given. However, when the basic wave (1064 nm) of $CO_2$ laser or ND:YAG laser is used as in the conventional case, it is difficult to generate the laser light in such a manner. In contrast to this, as the result of eager study, the present inventor founds that, when the THD (the third harmonic wave) of the Nd:YAG lasers which is a solid laser, (or Nd:YV04 laser) is irradiated, there is an effect in which the soil of the surface after the processing or de-poling when the piezoelectric material is processed, is suppressed. The inventor understands the reason as follows.

The wavelength of the THG (the third harmonic wave)of the Nd:YAG lasers (or Nd:YV04 laser) is 355 nm, and it can be said that the wavelength is considerably shorter than the basic wave. When the wavelength is short, the pulse width tends to be short, and the energy excited in a short time period is emitted, and the irradiated energy density is increased. Although it depends also on the kind of the crystal, the structure of the cavity, and repeated frequency, when the wavelength is short, there is an inclination in which the pulse with becomes short, and when the wavelength not larger than 355 nm, is used, it is also possible that the pulse width is made not longer than 100 ns. Further, when the wavelength is decreased, the absorptance of the light of the material to be processed is increased (that is, the reflection factor of the laser light is decreased), and it can also be processed more effectively. Further, when the wavelength is decreased, the spot diameter can be made small. This means that it is very much advantageous for the minute processing, and simultaneously, the energy density can be increased. By the above description, when the light of the high energy density is irradiated in a short period of time, the thermal influence caused by the irradiation can be limited in a considerably narrow range. That is, the soil of the surface after the processing or the de-poling when the piezoelectric material is processed can be suppressed.

It is clear that the above action exerts more advantageously when the wavelength is a short wavelength such as FHG (the forth harmonic wave) whose wavelength is shorter. However, in the case of the fourth or higher harmonic wave, because the conversion efficiency of the wavelength is low, and a sufficient output can not be taken out, although it can be said that the practicality is low in the present stage, the practical application can be expected in the future.

Further, according to the viewpoint of the shortness of the wavelength, theoretically, the eximer laser, which is the gas laser, can also be used for the laser processing. However, because the system is different, it can not be compared unconditionally, and because the repetition frequency can not be increased, it is not adequate, for example, for the high speed processing necessary for the electrode formation of the inkjet head. Further, in the eximer laser, because the space mode (beam profile) of the beam is not preferable, a dispersion in the depth direction of the processing surface of the material to be processed appears. Further, there is also a problem in which the apparatus by which the eximer laser is irradiated is difficult in the handling. In contrast to it, when the solid laser is used, the disadvantage when the above eximer laser is used can be avoided.

It is preferable that the space mode of the solid laser is TEM00 (single mode). TEM00 means an ideal Gaussian distribution, however, actually, some high order modes are superimposed, and the distribution becomes a condition in which it is widened more than the Gauss distribution. As the index to express them, there is M2 (M square) value, and the ideal Gauss distribution is a case in which M2 is 1. Accordingly, it is preferable when the laser is M2<1.2, and it is more preferable when the laser is M2<1.1.

Hereupon, it is preferable when the solid laser is the ND:YAG laser of Q switch pulse oscillation, and the laser light is the third harmonic wave, or it is preferable when the solid laser is the YVO4 laser of Q switch pulse oscillation, and the laser light is the third harmonic wave, however, the present invention is not limited to this.

Further, it is preferable when the solid laser is a Q switch pulse laser, and it is preferable that the solid laser is assembled in an optical system of a fixed image forming system, or it is preferable that the solid laser is assembled in an optical system using a galvano-mirror.

The Q switch pulse laser arranges an element controlling a Q value of the resonator (the inverse number of a loss during one reciprocation inside the resonator, when it is larger, the loss is lower), in the resonator of the laser. At the ordinary time periods, the situation in which Q is small=the loss is large is maintained, and the laser oscillation is controlled even when the laser is excited, and from the situation in which the energy is accumulated, the Q is switched in a short time period from "small" to "large". When conducted in such a manner, as comparing to a continuous oscillation or normal pulse oscillation, the laser output whose peak output is high and pulse width is narrow, is obtained.

As the Q switch element, a common element is an acoustic optical Q switch, and when the ultrasonic wave is propagated into the Q switch medium, a diffraction grating is formed in the medium, and a portion of the light which goes and returns in the resonator is diffracted and becomes a loss. When the ultrasonic wave is stopped from the above situation, the Q is instantaneously increased large, and the pulse output whose peak value is high, is obtained. The Q switch system in the present invention is the acoustic optical Q switch, and high speed repetition Q switch.

In the optical system using the galvano mirror (galvano scanner system), because the processing position changes interlocking with the movement of the mirror, on the other hand in which the high speed processing can be conducted, there is a feature in which it is weak for the noise, and the position accuracy is low. Further, because a large Fθ lens is necessary, theoretically, it is expected that this optical system is the same as the optical system of the fixed image formation system, however, the actual light converging limit is bad, and the spot diameter of the laser is larger than the fixed image formation system.

In the fixed image formation system, because the processing position is determined only by the position accuracy of the optical stage at which the material to be processed is located, the accurate processing can be conducted. Further, because the lens, which covers the wide range as the galvano mirror, is not necessary, the small light converging lens is enough, and the spot diameter can be more decreased than the galvano system. That is, although the high minute processing can be conducted, because the processing speed is limited by the moving speed of the optical stage, it is poor in the high speed processing. In this manner, because there is merits and demerits in respective processing systems, from the reason whether the feature which is required for the processing of the material to be processed is the accuracy or speed, it is preferable when it is selected which optical system is used.

Embodiment of the Invention

Figure 1:
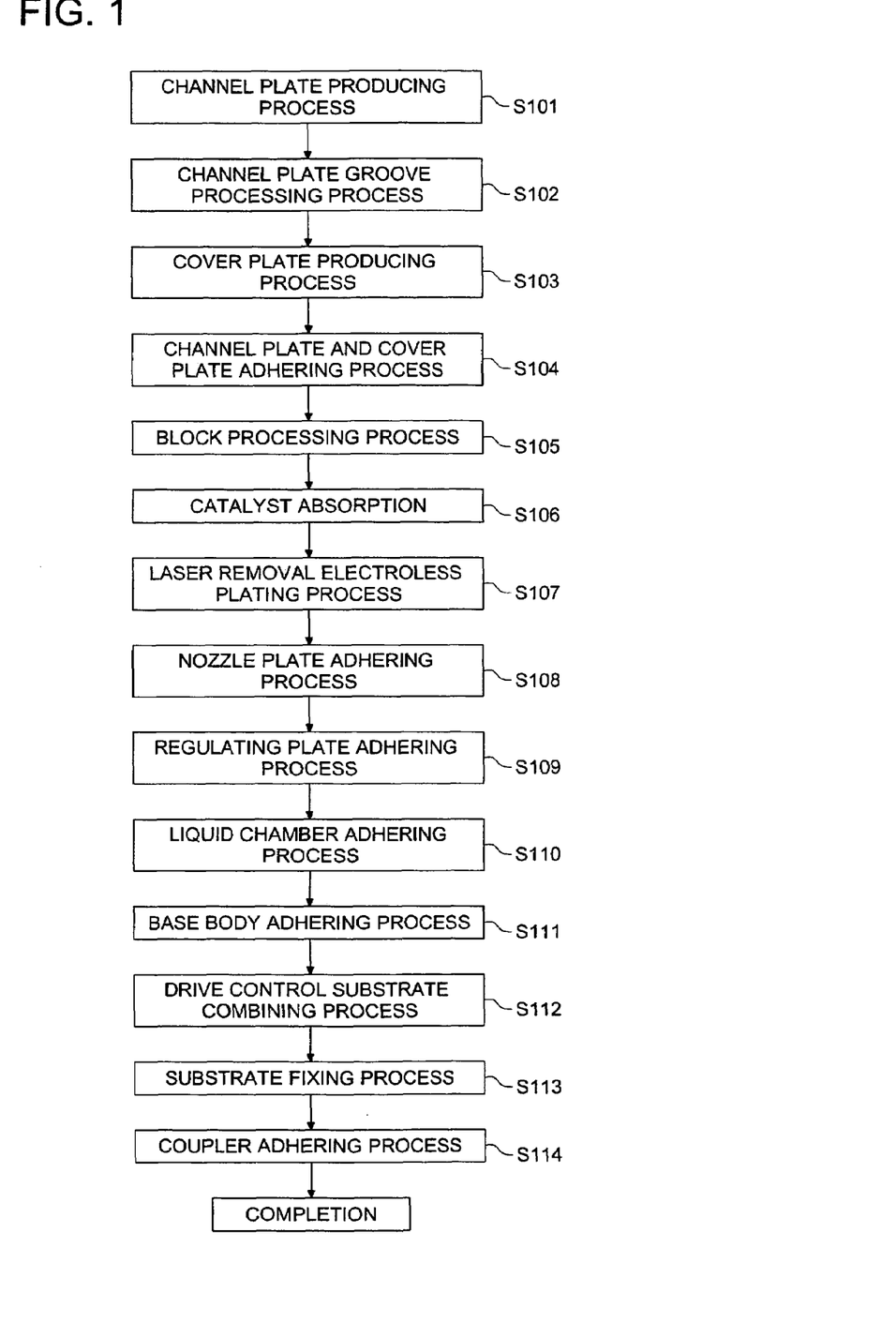
FIG. 1 is a view showing a flow of a production process of an inkjet print head.

Referring to the drawings, the summary of the production process of the head for the inkjet printer will be described below, before the laser processing method according to the present embodiment will be described. FIG. 1 is a view showing a flow of the production process of the inkjet print head, and FIG. 2(a)-(j) are general views of the production process of the inkjet print head. In the following, step S—indicates the steps in FIG. 1.

(Channel Plate Production (FIG. 2(a))

A channel plate 103 of thickness 1.057 mm including the adhesive agent layer is produced in such a manner that the adhesive agent layer is about 2 μm when a load of 14-20 Kg/cm and temperature of 90-100° C. are applied to them by adhering a plate material 101 of the polarization processed PZT of thickness 0.9 mm, and a plate material 102 of PZT (lead zirconate titanate) of thickness 0.155 mm to each other, aligning the polarization direction with a predetermined direction, for 30-40 minutes.

In a step S101 in which this channel plate 103 is produced, it is important that the very careful attention is paid, so that the operation is conducted in a clean room so that dusts are not affixed to the adhering surface, and further, so that the non-uniform adhesion or air bubble does not remain.

An operation in which two plate materials 101 and 102 of PZT are adhered, is for the reason that, when the voltage is applied, the deformation of the side wall is made large, when the side wall of the channel of the shearing mode inkjet print head is formed of two sheets of PZT.

(Channel Plate Groove Processing (FIG. 2(b))

In step S102, the channel plate 103 is ground, and a groove 104, which forms an ink channel, is formed.

In the case of this embodiment, in order to form 128 nozzles, by a blade B almost equal to the groove width, from the side of the plate material 102 of the thickness 0.155 mm of the channel plate 103, total 263 grooves whose depth is 0.31 mm, groove width 0.07 mm, wall width 0.071 mm, pitch 0.141 mm are processed to form a comb-shape.

In the case of this embodiment, because the air channel is provided on both sides of the ink channel, 257 grooves are necessary, and on their both sides, respective 4 mm holding portions are provided, and because, on the holding portion, respective 3 auxiliary grooves are provided successively to 257 grooves, the grooves result in total 263 grooves.

In this connection, respective 3 grooves on both sides are glue guards provided so that the excessive adhering agent does not enter into the nozzle area, when the nozzle plate is adhered.

(Cover Plate Production Process (FIG. 2(c))

In step S103, the plate material formed of PZT whose width and length are the same dimension as the groove processed channel plate 103 is prepared as the cover plate 110. The thick plate used for the channel plate production is commonly used, and used after the de-polarization.

Figure 2:
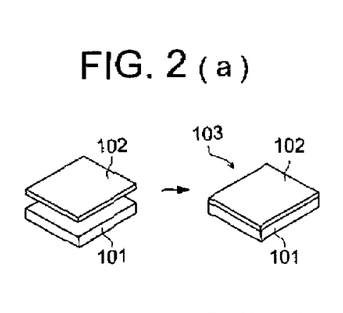
FIGS. 2(a) to (j) are general views of the production process of the inkjet print head.

(Adhesion of the Channel Plate and the Cover Plate (FIG. 2 (d)))

In step S104, the cover plate 110 is adhered to the groove processed channel plate 103. Because both are the same dimension, the jig is used, and both are adhered so that their positions do not dislocate. The adhesive agent is uniformly coated so that the thickness become about 2 µm after the heating and adhesion, and under the condition of 14-20 Kg/cm$^2$, temperature of 90-100° C., they are heated for about 30-40 minutes and adhered.

(Block Processing (FIG. 2(e))

In step S105, the adhered channel plate 103 and the cover plate 110 are cut (170) into the several strips whose width is 2 mm and the length is 44.166 mm, and the head chip 120 is formed, by the dicing processing.

(Catalyst Absorption (FIG. 2 (f)))

In step S106, the catalyst is absorbed in the head chip 120.

(Laser Removal of Electroless Plating (FIG. 2(g), (h)))

This electroless plating processing conducted in step S107 is the processing which is conducted by dipping the head chip 120 of the channel plate 103, and by which the catalyst is plating processed and a desired plating film is formed, and an electrode of a desired film thickness is formed. By the electroless Ni plating, when the plating of the predetermined film thickness is deposited, it is taken out from a processing tank 190, washed and dried. After that, the laser light D is irradiated on a part of the plating film and unnecessary plating is removed.

In this manner, the laser light D is irradiated on the plating thin film, and a pattern is formed. In this process, it is very important that the plating is uniformly affixed to all inner walls of 263 tubular holes of the channel (tubular holes of width 70 µm, height 310 µm, length 2 mm). The resist may also be coated on the cover plate portion unnecessary for the electrode formation, and nozzle plate adhering portion, so that the plating is not affixed. In this connection, when the material of the plating is the material whose electric resistance is small and in which the peel strength is high to the PZT, it is not limited to this.

In this embodiment, because the plating is conducted on a plurality of channels (cylindrical hole) provided in the head chip 120, in this case, it is difficult to conduct the plating processing on only inner walls of the channel, therefore, as will be described later, the electrode formation by the conductive film removal is more preferable. Herein, by removing a part of affixed metallic layer by the laser light D by a desired thickness, the wiring pattern is formed in such a manner that the metallic layer independently extending to respective drive sections is remained. Relating to such a processing, it will be described later referring to FIG. 4. When the conductive film removal by the laser light is completed, the electrode formation is completed.

(Nozzle Plate Adhesion (FIG. 2(i)))

In step S108, the end surface of the head chip 120 is ground, and the nozzle plate 130 is adhered. The nozzle plate 130 is formed of the stainless material or polyimide resin in which a plurality of openings 130a for the ink jetting are provided in the sheet-like thin plate. The shape dimensions such as the diameter of the opening. (nozzle diameter) of the nozzle plate 130, or thickness and width or length are different on the specification of the inkjet apparatus, and in this embodiment, 128 openings (nozzle) 130a of the opening diameter of about Φ18 µm are processed by the eximer laser in the polyimide resin sheet of the thickness about 1.25 µm, and the nozzle plate surface is water repellant processed so that the splashed ink drop does not influence on the nozzle opening 130a.

The adhesive agent is coated on a predetermined portion of the nozzle plate 130 or on a predetermined portion of the head chip 120, and after the adhesion to the head chip, it is inserted into the heater, and although it is changed depending on the kind of the adhesive agent, or the material to be adhered, in this embodiment, for example, when, at the temperature of about 80° C., heating is conducted for about 40 minutes, and further, the heating is conducted at about 100° C., for 20 minutes, the adhesion strength is increased.

In this connection, it is necessary that the caution is paid so that the nozzle plate 130 holds the parallel surfaces and so that the adhesive agent does not fill in the ink channel, and respective ink channels are adhered in such a manner they surely form the respectively independent spaces so that the leakage does not occur when the ink is injected. It is important that the amount of the adhesive agent and thickness of the adhesion layer are controlled so that the nozzle opening 130a is not filled up by the adhesive agent. Hereupon, when the plasma processing is conducted on the head chip 120 and the wetting property of the adhesive agent is promoted, the adhesion can be easily and surely conducted. Not only for the nozzle plate 130, but also for the adhesion of a regulating plate, it is desirable that the head chip 120 is plasma processed.

(Adhesion of a Regulating Plate (FIG. 2(j)))

In step S109, to the other end of the head chip 120 to which the nozzle plate 130 is adhered, a regulating plate (flow path regulating plate) 140 is adhered, and a head block 150 is produced.

In this connection, the regulating plate 140 has a function by which the ink does not flow into the air channels of both sides of the channel having the opening (nozzle) 130a, and a function by which the pressure variation in the channel for the ink jetting can be maintained to a predetermined pressure.

In this embodiment, 128 rectangular holes 140a whose width is 110 µm, length is 350 µm are provided at the pitch of 282 µm, in the 125 µm thick polyimide resin sheet whose material is the same as the nozzle plate 130. Of course, it is needless to say that these shape and dimensions are according to the specification of the inkjet apparatus, as the same as the nozzle plate 130, and it is not limited to this.

(Liquid Chamber Adhesion)

In step S110, when the nozzle plate 130 and a regulating plate 140 are adhered to the head chip 120, the head block 150 is completed. To this head block 150, a liquid chamber member (not shown) is fixedly adhered by the adhesive agent so that the ink can be supplied.

(Base Body Adhesion)

Furthermore, in step S111, when the head unit to which the head block 150 and the liquid chamber member are adhered, is adhered to the base body (not shown), the liquid chamber is structured, and the system is in the situation that the ink can be injected into the head unit. In the case of the adhesion of the head unit, it is necessary that the attention is paid to the position dislocation of the head block 150 of the head unit or inclination to the base body, and so that the ink leakage from the periphery of the liquid chamber member which is adhered to the base body does not occur. In this process, when the operability of the assembling is considered, the adhesive agent of a normal temperature hardening type is used.

Hereupon, in this embodiment, the liquid chamber is integrally structured with the base body on which the head block 150 is fixed, but, not depending on this, the liquid chamber may also be separately structured depending on the specification of the inkjet head or the structure in the design work, and dimensions such as the shape of the liquid chamber or the size are set according to the specification of the inkjet head, and particularly, the shape by which the ink smoothly flows in from the ink cartridge or ink bag, and smoothly enters into the channel of the head block 150, is important, and it is also possible that a filter for removing the dust or bubble in the ink is assembled, or a filter chamber in which the filter is separately assembled, is provided, and connected to the liquid chamber.

As in this embodiment, when the size of the head chip 120 is reduced, in addition to the reduction of the material cost, and other than a mechanical advantage in which, because it is enough that the weight or volume of the inkjet head is small, the cost is low as compared to the conventional one, and the degree of freedom for the head unit structure is increased, and further, the inertial force can also be lightened, there is an advantage in which the shear deformation of the PZT for jetting the ink can be made in the low voltage, and because the frequency can be increased, the printing speed can be increased.

(Drive Control Substrate Adhesion)

In step S112, with the head unit which is completed to a degree in which the ink can be injected, a drive control substrate (not shown) to apply the voltage for jetting the ink is combined.

In this embodiment, anisotropic conductive film (ACF) can be used for the connection electrode formed on the rear surface of the channel plate 103 of the head chip 120, and when the weight of about 14 Kg is uniformly applied for about 20 sec at about 170° C., and it is heated and pressed, it is electrically combined with a flexible print circuit (FPC) connected to the drive control substrate.

(Substrate Fixation)

In step s113, the head unit and the drive control substrate are attached to the base body, and the inkjet print head is completed.

(Coupler Adhesion)

In step S114, the coupler (not shown) is adhered to the base body of this inkjet print-head, and the ink is injected into the liquid chamber member through the coupler from a separately provided ink injection apparatus, and the power source is connected to a connector provided on the drive control substrate, and when the control to jet the ink is conducted, the ink can be jetted from the nozzle of the inkjet print head.

Figure 3:
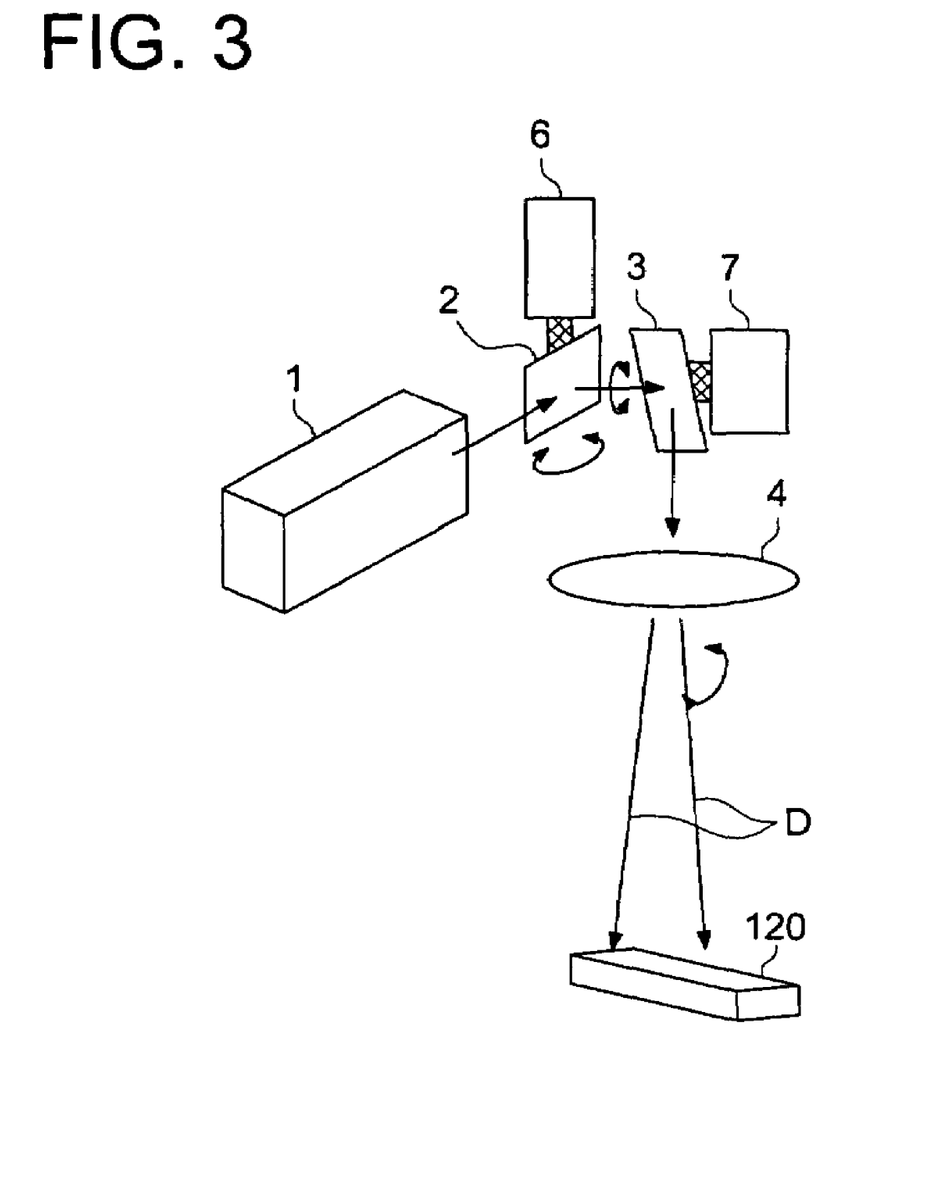
FIG. 3 is a perspective view of a main part of the processing apparatus according to the present embodiment.

The laser processing method and the laser processing apparatus which are conducted in the processing process in step S107, and used for removing the metallic layer will be detailed below. FIG. 3 is a perspective view of the main part of the processing apparatus according to the present embodiment. In FIG. 3, the laser light D irradiated from the laser light source 1, is reflected on the first galvano mirror 2, and further reflected on the second galvano mirror 3, and irradiated through the fθ lens 4 on the head 120 as the material to be processed. In this connection, the first galvano mirror 2 is rotated by the first drive section 6, and used for scanning the surface of the head 120 by the laser light D, and the second galvano mirror 3 is rotated by the second drive section 7, and for example, used for changing the irradiation position of the laser light D so that the laser light is on the adjoining scanning line. In this connection, it can also be considered that the solid laser is assembled in the optical system provided with a fixed image formation system, other than a case where the solid laser is assembled in the optical system provided with such a galvano mirror. Relating to these optical systems, they are well known, and because the selection of the system is above described, the details will be not described below.

As the laser light to remove the metallic layer such as Ni plating, the third harmonics (355 nm) of Nd:YAG laser which is a solid laser, or Nd:YVO 4 laser is preferable, but, the laser light of harmonics not lower than the fourth harmonics (266 nm) may also be used.

Figure 4:
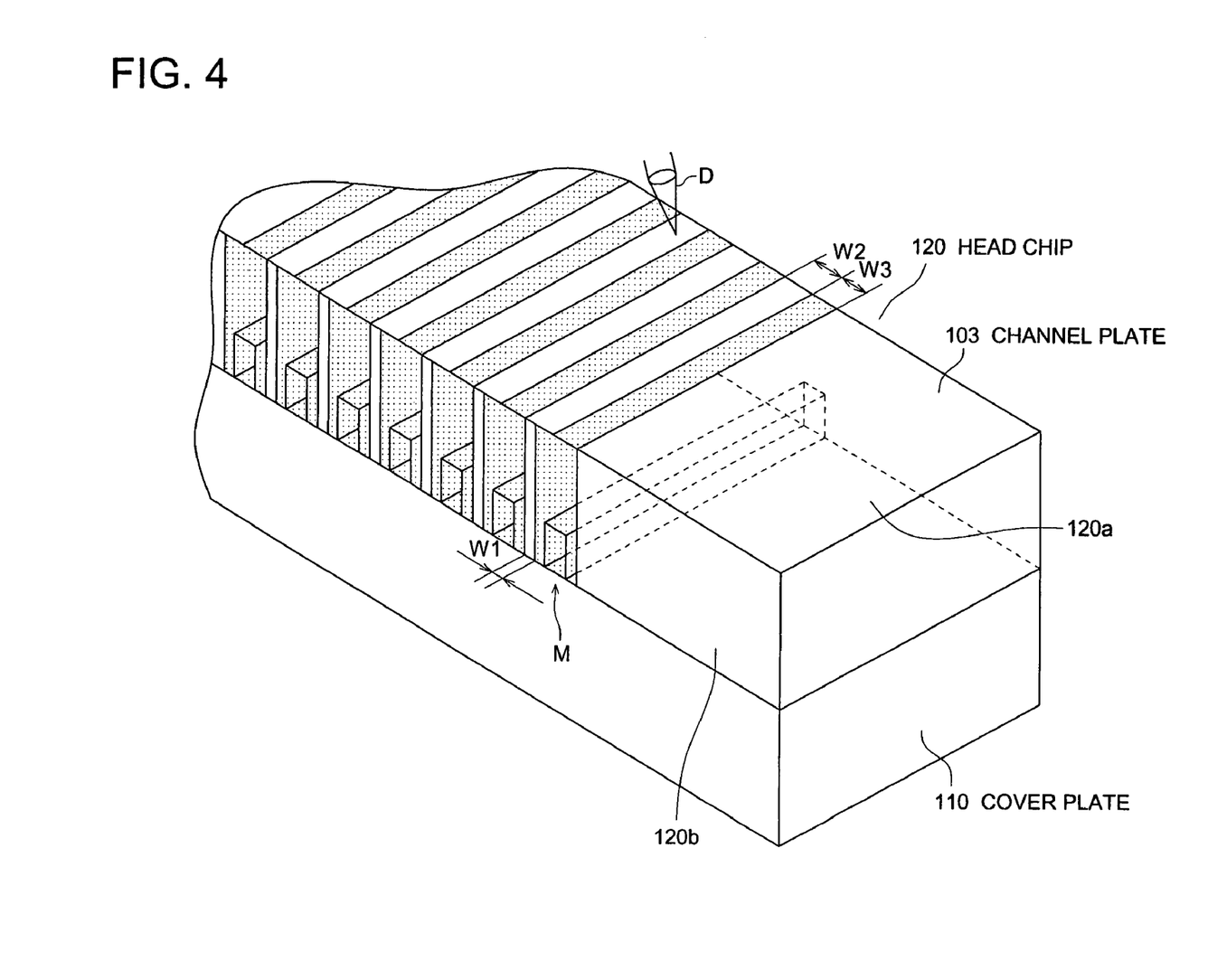
FIG. 4 is a partial perspective view of a head 120 in the processed situation.

FIG. 4 is a partial perspective view of the head chip (also called a head) 120 in the processed situation. The head 120 has a pair of the drive sections (PZT 101, 102 in FIG. 2) in which, when the current is supplied, the cross section is deformed like dogleg and which push out the ink (not shown) existing between them, in its inside, and its end portion is exposed on the surface. As described below, the wiring to it is formed on the surface of the head 120. In the process described above, it is presumed that the metallic layer M is coated on the whole of the upper surface 120a of the head 120, and the front surface 120b, by the plating (Ni is preferable, but not limited to it).

In this situation, the metallic layer M is brought into contact with over the end portion of the drive section, and the outside power source can be connected through the metallic film M, but, in the situation as it is, because the potential of the pair of drive sections are equal to each other, the drive section can not be operated. Accordingly, as shown by a hatching in FIG. 4, when a part of the adhered metallic layer is removed by the laser light D, the metallic layer M independently extending to respective drive sections, is remained.

In this case, because it is necessary that the flow path regulating plate (regulating plate 140 in FIG. 2) is adequately adhered, it is necessary that the removal portion of the metallic layer is removed by a comparatively narrow width W1 so that its flatness is maintained. On the one hand, because the upper surface 120a of the head 120 is combined with the flexible print substrate (not shown), it is preferable that the removal of the metallic layer is conducted so that width of the metallic layer coating portion (W3) and width of the metallic layer removal portion (W2) are formed approximately equal. That is, the relationship of W1 ≦W2 is preferable.

In the present embodiment, when the THG (the third harmonics) of the Nd:YAG laser as the solid laser (or Nd:YVO4 laser) is irradiated, on the surface after the processing, the soil or burr and dross by the splash of the melted material, are very few, and its flatness can be secured, and further, because the pulse width is short, the heat accumulation effect at the time of the laser irradiation is small, and there is no de-poling of the piezoelectric material which is the material to be processed, and the drive efficiency of the inkjet head is increased. Namely, in this embodiment drive voltage rise due to de-poling was not observed.

In this connection, in the present embodiment, Ni plating film is used as the metallic layer, however, in order to remove the metallic layer such as Ni plating film, and suppress the influence on the periphery, the short wavelength laser such as THG of the ND:YAG laser is preferable. It is considered for the following reason that, as shorter the wavelength of the laser is, the higher the absorption factor is increased, and much laser energy is absorbed in the Ni plating portion, and the energy is easily consumed, and the influence on the PZT which is a substrate becomes small. In the present embodiment, the thickness of the Ni plating layer is 2 μm.

The result of the comparative test made by the present inventors will be shown below.

EXAMPLE

[1] Test Condition
(1) the used laser: the third harmonics (wavelength 355 nm) of Nd:YAG laser
(2) the pulse width at the time of processing: 60 ns
(3) M2: 1.05
(4) average power: 1.8 W
(5) repetition frequency of Q switch: 30 kHz

[2] Test Result
(1) processing width: 16.02 μm
(2) processing depth: 5.78 μm
(3) burr height: 1.18 μm
(4) processing influence area (distance from the edge of the processing range): 3.28 μm
(5) drive voltage: 10.6 V
(6) observation result of the processed part: the external appearance of the processed part of the material to be processed is good, and also the melted material splashed on the periphery of the processed part is not spread to only 3.28 μm. The edge of the processed part is also sharp.

Comparative Example 1

[1] Test Condition
(1) used laser: the second harmonics (wavelength 532 nm) of Nd:YAG laser
(2) pulse width at the time of processing: 165 ns
(3) M2: 1.35
(4) average power: 3.2 W
(5) repetition frequency of Q switch: 16 kHz

[2] Test Result
(1) processing width: 18.3 μm
(2) processing depth: 8.1 μm
(3) burr height: 3.63 μm
(4) processing influence area: 32.6 μm
(5) drive voltage: 13.2 V
(6) observation result of the processed part:
The external appearance of the processed part of the material to be processed is bad, and the melted material is spread to 32.6 μm. The edge of the processed part is a gentle slope and even the piezoelectric material of the substrate is melted.

Comparative Example 2

[1] Test Condition
(1) used laser: the second harmonics (wavelength 532 nm) of Nd:YAG laser
(2) pulse width at the time of processing: 140 ns
(3) M2: 1.25
(4) average power: 2.7 W
(5) repetition frequency of Q switch: 20 kHz

[2] Test Result
(1) processing width: 17.7 μm
(2) processing depth: 7.9 μm
(3) burr height: 3.41 μm
(4) processing influence area: 18.5 μm
(5) drive voltage: 12.8 V
(6) observation result of the processed part:
The processing external appearance of the material to be processed is bad as same as comparative example 1, and the melted material is spread to 18.5 μm. The edge of the processed part is a gentle slope and even the piezoelectric material of the substrate is melted.

Comparative Example 3

[1] Test Condition
(1) used laser: the fundamental wave (wavelength 1064 nm) of Nd:YAG laser
(2) pulse width at the time of processing: 220 ns
(3) M2: 1.25
(4) average power: 4.3 W
(5) repetition frequency of Q switch: 20 kHz

[2] Test Result
(1) processing width: 22.3 μm
(2) processing depth: 10.4 μm
(3) burr height: 5.24 μm
(4) processing influence area: 25.1 μm
(5) drive voltage: 14.1 V
(6) observation result of the processed part:
The processing external appearance of the material to be processed is bad, and the melted material is spread to 25.1 μm. The edge of the processed part is a gentle slope and the upsurge as the burr is also large.

Figure 5A:
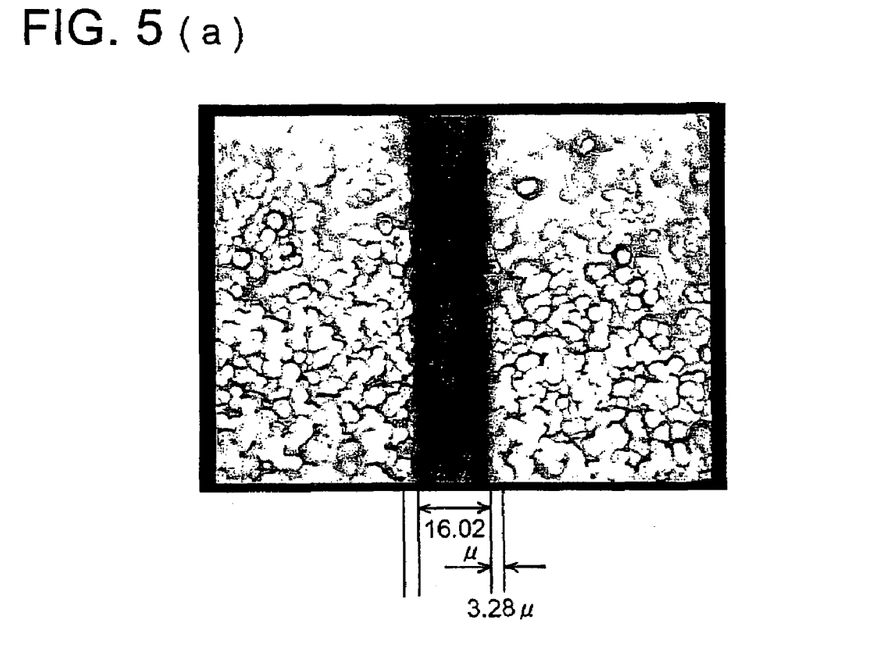
FIG. 5(a) and FIG. 5(b) show micrographs after the laser processing of an example and comparative example 1.
Figure 5B:
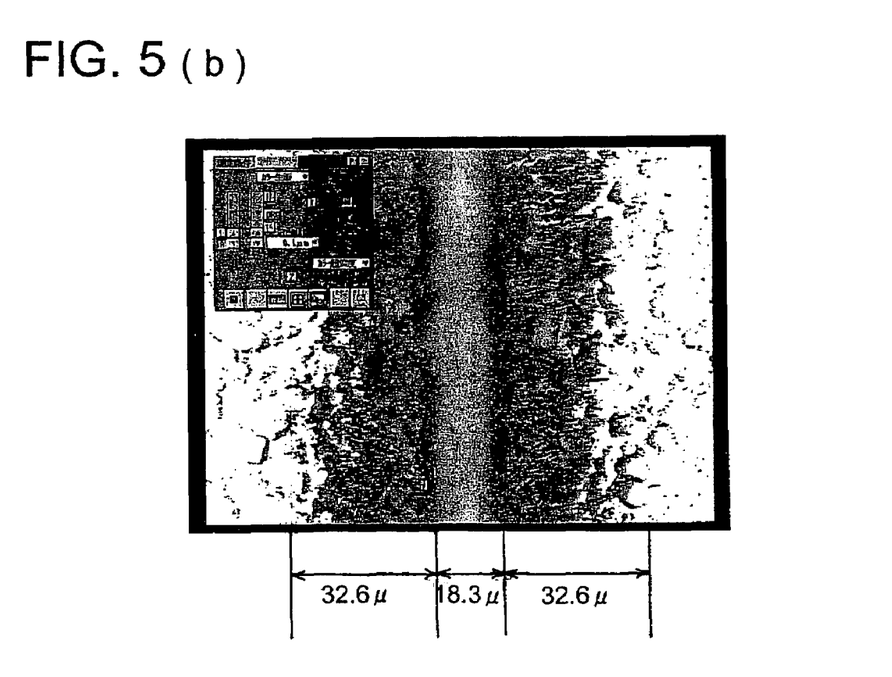

FIG. 5(a) is a micrograph of the surface processed by the THG laser of the example, and FIG. 5(b) shows a micrograph of the surface processed by a SHG laser of the comparative example 1. In the example, it can be seen that the burr around the processing machine is small, and the surface is very accurately processed. As can clearly be seen from the above test result, it can be seen that the condition of the processed part of the example is better than any comparative example.

Herein, as can be seen from the following description, it is preferable that the height of the burr is not greater than 2 μm, and in the example, the height of the burr is 1.2 μm and good. Generally, a concave and convex of 2-3 μm exist on the surface of the PZT. This can clearly be seen from the reason that the average particle diameter of the PZT is about 5 μm, and upper semi-spherical part appears on the surface. It can be seen that, when the concave and convex are taken at the peak, they are more enlarged. On the one hand, it is necessary that the adhesion of the nozzle plate or flow path regulating plate is conducted in such a manner that the adhesive agent is coated thinly and uniformly so that the adhesive agent does not flow into the ink channel. Generally, the adhesive agent is coated by the transferring method, and the average film thickness is about 8 μm. When there is a step difference not smaller than 5 μm in the normal adhering process, the yield is quickly decreased. This is for the reason that when the PZT particles exist in the periphery of the convex part of the surface, because there is a possibility that it exceeds the average film thickness of the adhesive agent, the "lifting" is generated in the nozzle plate, and the air layer enters between them. In the present invention, the plating is made on the PZT surface, and the concave part of the surface is filled by the plating. Accordingly, even when the burr generated by the laser processing is affixed to the PZT particle projected from the surface, it is necessary that its height is within the range in which it does not exceed the film thickness of the adhesive agent. Then, the height of the burr is not larger than 3 μm, and it can be said that, considering the safety, the height of the burr not larger than 2 μm is the height of the burr in which the yield of the adhesion process in the after-process is not reduced.

Further, it is desirable from the following reason that the processing influence area (the width of the range which is subjected to a damage by the laser processing) is not larger than 5 μm, and in the example, this processing influence area is 3.28 μm, and good.

In the present embodiment, the melted material (dross) generated at the time of the laser processing is the melted material of Ni metallic layer on the surface and the PZT, and naturally, such a material is wanted to reduce to "0". Ideally, it is preferable that the laser light is effectively absorbed only in the surface portion to be wanted to remove, and vaporized. In the laser processing, the material to be processed is divided into a material which is removed (vaporized) and scattered into the air, a material such as soot which is re-solidified and accumulated on the surface and a material which does not evaporated but only dissolved, and a material which does not dissolve and only whose temperature is raised. The material called the burr or dross (as the material, both are the same) is a dissolution material, and because the material itself has the high temperature heat, when it flows out and remains on the surface after the processing, bad influence such as depolarization is easily exerted on the PZT. (Because the heat of a vaporized material is scattered into the air, the influence onto the surface of the material to be processed is small.) When the amount of the dissolution material is large, the height of the burr is also high, and in the result, the adhesion problem relating to the height of the burr is generated.

The dissolution material is a conductor when Ni is a main component, and when the PZT is a main component, it is a dielectric substance. In the present embodiment, because a portion between both electrodes formed by the laser should not be conducted, an amount of the depth for one layer of the metallic layer+PZT particle is removed. That is, in the dissolution material, the PZT existing in the deep portion is a main component. When the dissolution substance affixes onto the surface of the material to be processed, the metallic layer formed as the electrode is partially coated by the melted material whose main component is the PZT, and the electrical contact is difficult to be made. In the present embodiment, because the channel pitch is 141 μm, and the channel width is 70 μm, the electrode width is 71 μm. When the melted material of 35.5 μm flows out from both sides, the electrode is completely coated. When the channel pitch becomes narrow and 70 μm (360 dpi), the electrode is coated by the flow-out of 17.5 μm. Generally, the connection of both electrodes is preferable that the electrode portion and no-electrode portion is near to 1:1, and the very much increase of the no-electrode portion by the melted material is not preferable. Further, in the case where the channel pitch is 70 μm, it is necessary that the thickness of the wall to form the channel is, in order to maintain the strength of the wall of 35 μm, when the thickness for the one layer of PZT particle is secured on both sides, stayed in the processing width of 25 μm. For the processing diameter (spot size) of the laser, although it depends on a focal distance of the light converging lens or the original laser diameter, generally, about 10 μm is the limit which can be found by the calculation, and practically, it is lager than this diameter. When the processing diameter is reduced to about 15 μm and processed, it is necessary that the melted material stays in the range to 5 μm. According to the above description, it is preferable that the processing influence area of the laser processing is not larger than 5 μm.

As described above, the present invention is described referring to the embodiment, and the present invention should not be construed by limiting to the above embodiment, but it is of course that change and improvement can be appropriately made.

According to the present invention described above, the laser processing method can be provided by which, while the processing surface situation of the material to be processed is maintained good, the precision processing can be conducted.

What is claimed is:

1. A method for making an inkjet head, comprising:
   forming a metallic layer on a surface of a head chip;
   irradiating a laser beam on the metallic layer to remove a part of the metallic layer, to form an independent electrode pattern;
   adhering a print circuit, connected to a drive control substrate, on a plane of the head chip such that the print circuit contacts the electrode pattern formed on the head chip;
   wherein the laser beam is emitted from a solid laser and has a wavelength of not longer than 355 nm, and M square ($M^2$) value for beam profile of the laser beam is smaller than 1.2, where the M square value is a coefficient indicating a degree of broadening of the laser beam profile compared to a broadening of a laser beam profile having Gaussian spatial distribution.

2. The method of claim 1, wherein the solid laser is a Nd:YAG laser, and the laser beam is a third harmonic wave.

3. The method of claim 1, wherein the solid laser is a YVO4 laser, and the laser beam is a third harmonic wave.

4. The method of claim 1, wherein the solid laser is a Q switch pulse laser.

5. The method of claim 1, wherein the solid laser is assembled in an optical system of a fixed image focusing system.

6. The method of claim 1, wherein the solid laser is assembled in an optical system using a galvano-mirror.

7. The method of claim 1, wherein a height of burr formed in the laser processing is not greater than 2 μm.

8. The method of claim 1, wherein an influence area by the laser processing is within 5 μm from an edge of a laser processed portion.

9. The method of claim 1, wherein the head chip comprises PZT.

10. The method of claim 1, wherein the metallic layer comprises an electroless Ni plating layer.

11. The method of claim 1, wherein the head chip comprises PZT, and the metallic layer comprises an electroless Ni plating layer.

12. The method of claim 11, wherein the M square ($M^2$) value for the beam profile of the laser beam is smaller than 1.1.

13. A method for making an inkjet head, comprising a step of irradiating a laser beam to an inkjet head material for removing a part of the inkjet head material, wherein the laser beam is emitted from a Nd:YAG laser, and the laser beam is a third harmonic wave, and wherein M square (M ) value for a beam profile of the laser beam is smaller than 1.2, where the M square value is a coefficient indicating a degree of broadening of the laser beam profile compared to a broadening of a laser beam profile having Gaussian spatial distribution.

14. The method of claim 13, wherein an influence area by the laser processing is within 5 μm from an edge of a laser processed portion.

15. A method for making an inkjet head, comprising a step of irradiating a laser beam to an inkjet head material for removing a part of the inkjet head material, wherein the laser beam is emitted from a YVO4 laser, and the laser beam is a third harmonic wave, and wherein M square ($M^2$) value for a beam profile of the laser beam is smaller than 1.2, where the M square value is a coefficient indicating a degree of broadening of the laser beam profile compared to a broadening of a laser beam profile having Gaussian spatial distribution.

16. The method of claim 15, wherein an influence area by the laser processing is within 5 μm from an edge of a laser processed portion.

* * * * *